United States Patent
An et al.

(10) Patent No.: US 9,218,115 B2
(45) Date of Patent: Dec. 22, 2015

(54) INPUT DEVICE AND IMAGE DISPLAY APPARATUS INCLUDING THE SAME

(75) Inventors: Sungyul An, Seoul (KR); Kyungwon Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 136 days.

(21) Appl. No.: 13/307,156

(22) Filed: Nov. 30, 2011

(65) Prior Publication Data

US 2012/0146925 A1    Jun. 14, 2012

(30) Foreign Application Priority Data

Dec. 2, 2010  (KR) .................. 10-2010-0121722
Jul. 21, 2011  (KR) .................. 10-2011-0072399

(51) Int. Cl.
| | |
|---|---|
| *G06F 3/0484* | (2013.01) |
| *G06F 3/0354* | (2013.01) |
| *G06F 3/041* | (2006.01) |
| *G06F 3/0488* | (2013.01) |
| *H05B 33/08* | (2006.01) |
| *F21V 8/00* | (2006.01) |
| *H03K 17/96* | (2006.01) |

(52) U.S. Cl.
CPC ........ *G06F 3/04847* (2013.01); *G06F 3/03547* (2013.01); *G06F 3/041* (2013.01); *G06F 3/0488* (2013.01); *H05B 33/0863* (2013.01); *G02B 6/0068* (2013.01); *G02B 6/0073* (2013.01); *H03K 17/962* (2013.01); *H03K 2217/96042* (2013.01); *H03K 2217/96066* (2013.01); *H03K 2217/96079* (2013.01)

(58) Field of Classification Search
CPC . G06F 3/04847; G06F 3/03547; G06F 3/041; G06F 3/0488; H05B 33/0863; G02B 6/066; G02B 6/0073; G02B 6/006; G02B 6/0068
See application file for complete search history.

(56) References Cited

U.S. PATENT DOCUMENTS

| | | | |
|---|---|---|---|
| 6,057,878 A | 5/2000 | Ogiwara | |
| 6,094,216 A | 7/2000 | Taniguchi | |
| 6,271,896 B2 | 8/2001 | Moseley et al. | |
| 7,190,518 B1 | 3/2007 | Kleinberger et al. | ......... 359/465 |
| 7,787,008 B2 | 8/2010 | Fukushima et al. | ............ 348/51 |
| 7,944,464 B2 | 5/2011 | Fukushima et al. | ............ 348/51 |
| 8,130,272 B2 | 3/2012 | Pastoor | |
| 8,410,996 B2 | 4/2013 | Lee et al. | .......................... 345/6 |

(Continued)

FOREIGN PATENT DOCUMENTS

| | | |
|---|---|---|
| CN | 2603418 Y | 2/2004 |
| CN | 1949886 A | 4/2007 |

(Continued)

OTHER PUBLICATIONS

Office Action dated Aug. 1, 2013 for co-pending U.S. Appl. No. 13/307,206.

(Continued)

*Primary Examiner* — Latanya Bibbins
(74) *Attorney, Agent, or Firm* — KED & Associates LLP

(57) ABSTRACT

An input device and an image display apparatus are provided. The image display apparatus may include a display, and an input device adjacent to the display. The input device may include a first light emitting device (LED), a second light emitting device (LED), a touch sensor to detect a touch input, and a light source controller to control an intensity of light from the light guide based on the touch input.

5 Claims, 19 Drawing Sheets

(56) References Cited

U.S. PATENT DOCUMENTS

| | | | |
|---|---|---|---|
| 8,493,439 B2 | 7/2013 | Park | 348/59 |
| 8,537,292 B2 | 9/2013 | Lin | 349/15 |
| 8,553,030 B2 | 10/2013 | Chen et al. | 345/419 |
| 8,582,062 B2 | 11/2013 | Kim et al. | 349/122 |
| 8,614,772 B2 | 12/2013 | Lin | |
| 8,614,774 B2 | 12/2013 | Uehara et al. | 349/57 |
| 8,760,761 B2 | 6/2014 | Uehara | 359/464 |
| 8,773,517 B2 | 7/2014 | Niioka et al. | 348/54 |
| 2001/0019479 A1* | 9/2001 | Nakabayashi et al. | 362/31 |
| 2003/0007204 A1 | 1/2003 | Ashizaki | |
| 2003/0210537 A1 | 11/2003 | Engelmann | 362/26 |
| 2004/0207605 A1 | 10/2004 | Mackey et al. | 345/173 |
| 2004/0245440 A1 | 12/2004 | Klippstein et al. | 250/226 |
| 2005/0105179 A1 | 5/2005 | Taira | |
| 2005/0225502 A1 | 10/2005 | Nam et al. | 345/55 |
| 2005/0259323 A1 | 11/2005 | Fukushima et al. | 359/462 |
| 2005/0285997 A1 | 12/2005 | Koyama et al. | |
| 2006/0082520 A1 | 4/2006 | Otte | 345/32 |
| 2006/0114415 A1 | 6/2006 | Shestak et al. | |
| 2006/0125916 A1 | 6/2006 | Mashitani | |
| 2006/0132458 A1 | 6/2006 | Garfio et al. | 345/173 |
| 2006/0139448 A1 | 6/2006 | Ha et al. | |
| 2006/0146208 A1 | 7/2006 | Kim | |
| 2006/0170616 A1 | 8/2006 | Hirayama et al. | 345/32 |
| 2006/0268185 A1 | 11/2006 | Hamagishi et al. | |
| 2006/0279554 A1* | 12/2006 | Shin et al. | 345/173 |
| 2006/0279580 A1 | 12/2006 | Akka et al. | 345/582 |
| 2006/0285206 A1 | 12/2006 | Tzschoppe | 359/465 |
| 2006/0290685 A1 | 12/2006 | Nagakubo | 345/175 |
| 2007/0003134 A1 | 1/2007 | Song et al. | 382/154 |
| 2007/0058113 A1 | 3/2007 | Wu et al. | |
| 2007/0058127 A1 | 3/2007 | Mather et al. | |
| 2007/0058258 A1 | 3/2007 | Mather et al. | |
| 2007/0121076 A1 | 5/2007 | Klippstein et al. | 353/30 |
| 2007/0139615 A1 | 6/2007 | Tzschoppe et al. | 352/57 |
| 2007/0152983 A1 | 7/2007 | McKillop et al. | 345/32 |
| 2007/0236959 A1 | 10/2007 | Tolbert et al. | 362/616 |
| 2008/0165296 A1 | 7/2008 | Kim et al. | |
| 2008/0186736 A1 | 8/2008 | Rinko | 362/615 |
| 2008/0191964 A1 | 8/2008 | Spengler | |
| 2008/0211734 A1 | 9/2008 | Huitema et al. | |
| 2008/0231767 A1 | 9/2008 | Lee | |
| 2008/0231952 A1 | 9/2008 | Kim | 359/465 |
| 2008/0239482 A1 | 10/2008 | Fukushima | |
| 2008/0259233 A1 | 10/2008 | Krijn et al. | 349/15 |
| 2008/0266525 A1 | 10/2008 | Relke et al. | 353/8 |
| 2008/0291126 A1 | 11/2008 | Hamagishi | 345/55 |
| 2008/0291500 A1 | 11/2008 | Asai | |
| 2008/0316597 A1 | 12/2008 | Tsai et al. | |
| 2009/0002262 A1 | 1/2009 | Fukushima et al. | 345/1.1 |
| 2009/0079733 A1 | 3/2009 | Fukushima et al. | |
| 2009/0102916 A1 | 4/2009 | Saishu | |
| 2009/0128547 A1 | 5/2009 | Park | |
| 2009/0128900 A1 | 5/2009 | Grasnick | 359/462 |
| 2009/0174673 A1* | 7/2009 | Ciesla | 345/173 |
| 2009/0190096 A1 | 7/2009 | Chen | |
| 2009/0195642 A1 | 8/2009 | Fukushima et al. | 348/51 |
| 2009/0225244 A1 | 9/2009 | Wang et al. | |
| 2009/0244387 A1 | 10/2009 | Lee et al. | |
| 2009/0278936 A1 | 11/2009 | Pastoor et al. | 348/169 |
| 2009/0315883 A1 | 12/2009 | King | 345/419 |
| 2010/0033813 A1 | 2/2010 | Rogoff | |
| 2010/0046069 A1 | 2/2010 | Otte et al. | 359/462 |
| 2010/0073768 A1 | 3/2010 | Kim et al. | |
| 2010/0091205 A1 | 4/2010 | Wu et al. | 349/15 |
| 2010/0118045 A1 | 5/2010 | Elliott | |
| 2010/0118403 A1 | 5/2010 | Laitinen et al. | |
| 2010/0137033 A1 | 6/2010 | Lee | 455/566 |
| 2010/0156508 A1 | 6/2010 | Yato | 327/517 |
| 2010/0171811 A1 | 7/2010 | Kamins-Naske et al. | 348/40 |
| 2010/0182408 A1 | 7/2010 | Liu | 348/51 |
| 2010/0238275 A1 | 9/2010 | Otte et al. | 348/54 |
| 2010/0245289 A1* | 9/2010 | Svajda | 345/175 |
| 2010/0254158 A1 | 10/2010 | Harton et al. | 362/607 |
| 2010/0302799 A1* | 12/2010 | Rosberg et al. | 362/602 |
| 2010/0309204 A1 | 12/2010 | Smith et al. | 345/419 |
| 2010/0309296 A1 | 12/2010 | Harrold | |
| 2010/0315324 A1 | 12/2010 | Nam et al. | |
| 2010/0315492 A1 | 12/2010 | Baik | |
| 2011/0038043 A1 | 2/2011 | Lin et al. | |
| 2011/0043615 A1 | 2/2011 | Saishu et al. | 348/51 |
| 2011/0117958 A1 | 5/2011 | Kim et al. | |
| 2011/0157171 A1 | 6/2011 | Lin | |
| 2011/0157471 A1 | 6/2011 | Seshadri et al. | 348/564 |
| 2011/0157696 A1 | 6/2011 | Bennett et al. | 359/462 |
| 2011/0157697 A1 | 6/2011 | Bennett et al. | 359/462 |
| 2011/0169919 A1 | 7/2011 | Karaoguz et al. | 348/46 |
| 2011/0181706 A1 | 7/2011 | Harrold et al. | |
| 2011/0221655 A1 | 9/2011 | Fukui | |
| 2011/0234929 A1 | 9/2011 | Lin | |
| 2011/0242441 A1 | 10/2011 | Minami | |
| 2011/0265002 A1* | 10/2011 | Hong et al. | 715/702 |
| 2011/0285698 A1 | 11/2011 | Tzschoppe et al. | 345/419 |
| 2011/0304707 A1 | 12/2011 | Oyagi | |
| 2011/0304716 A1 | 12/2011 | Sato et al. | |
| 2011/0317129 A1 | 12/2011 | Hsu et al. | |
| 2012/0032913 A1 | 2/2012 | Shih et al. | |
| 2012/0033058 A1 | 2/2012 | Yamauchi | |
| 2012/0038632 A1 | 2/2012 | Matsunaga | |
| 2012/0038634 A1 | 2/2012 | Cha et al. | |
| 2012/0047453 A1* | 2/2012 | Hale et al. | 715/773 |
| 2012/0062990 A1 | 3/2012 | Okamoto | 359/463 |
| 2012/0062991 A1 | 3/2012 | Krijn | |
| 2012/0063169 A1* | 3/2012 | Ahed et al. | 362/611 |
| 2012/0075698 A1 | 3/2012 | Minami | |
| 2012/0081776 A1 | 4/2012 | Yeh et al. | |
| 2012/0086708 A1 | 4/2012 | Lin | |
| 2012/0092337 A1 | 4/2012 | Tsao | |
| 2012/0092763 A1 | 4/2012 | Song | |
| 2012/0098827 A1 | 4/2012 | Yoshifuji et al. | 345/419 |
| 2012/0105954 A1 | 5/2012 | Prouty, IV | 359/462 |
| 2012/0120213 A1 | 5/2012 | Ohyama et al. | 348/60 |
| 2012/0162761 A1 | 6/2012 | Grasnick et al. | 359/462 |
| 2012/0182407 A1 | 7/2012 | Yoshida | |
| 2012/0274630 A1 | 11/2012 | Lin | |
| 2012/0314937 A1 | 12/2012 | Kim | |
| 2012/0327073 A1 | 12/2012 | Cha et al. | |
| 2012/0327074 A1 | 12/2012 | Lee | |
| 2013/0003128 A1 | 1/2013 | Watanabe | |
| 2014/0139651 A1 | 5/2014 | Jiang | |

FOREIGN PATENT DOCUMENTS

| | | |
|---|---|---|
| CN | 201117490 Y | 9/2008 |
| CN | 101361016 A | 2/2009 |
| CN | 101742343 A | 6/2010 |
| CN | 101751176 A | 6/2010 |
| CN | 102004324 A | 4/2011 |
| CN | 102056003 A | 5/2011 |
| EP | 0 791 847 A1 | 8/1997 |
| EP | 1 273 851 A2 | 1/2003 |
| EP | 2 136 225 A1 | 12/2009 |
| JP | 2008-058790 A | 3/2008 |
| KR | 10-2008-0044626 A | 5/2008 |
| WO | WO 2010/025139 A2 | 3/2010 |
| WO | WO 2010/103860 A2 | 9/2010 |

OTHER PUBLICATIONS

Chinese Office Action issued in related Application No. 201110462514.5 dated Jun. 4, 2014.
European Search Report dated Feb. 13, 2014, issued in Application No. 11 00 9465.
European Search Report dated Feb. 13, 2014, issued in Application No. 11 00 9466.
Chinese Office Action and Search Report dated Mar. 21, 2014, issued in Application No. 201210210695.7.
United States Office Action dated Apr. 22, 2014, issued in U.S. Appl. No. 13/307,206.
Chinese Office Action dated Apr. 30, 2014 issued in foreign Applicaton No. 201210209626.4.
Chinese Office Action dated Mar. 31, 2014, on Chinese Patent Application No. 201110462139.4.

(56) References Cited

OTHER PUBLICATIONS

Office Action issued in co-pending U.S. Appl. No. 13/307,206 dated Nov. 7, 2014.
Office Action dated Sep. 26, 2014, issued in U.S. Appl. No. 13/476,707.
Office Action dated Nov. 7, 2014, issued in U.S. Appl. No. 13/307,206.
U.S. Office Action issued in U.S. Appl. No. 13/476,707 dated Apr. 1, 2015.
U.S. Office Action issued in U.S. Appl. No. 13/476,724 dated Mar. 25, 2015.
U.S. Final Office Action for U.S. Appl. No. 13/476,724 dated Aug. 31, 2015.
U.S. Office Action for U.S. Appl. No. 13/476,707 dated Sep. 23, 2015.

* cited by examiner (a)          (b)

(a)          (b)

INPUT DEVICE AND IMAGE DISPLAY APPARATUS INCLUDING THE SAME

CROSS-REFERENCE TO RELATED APPLICATION(S)

This application claims the priority benefit of Korean Patent Application Nos. 10-2010-0121722, filed on Dec. 2, 2010, and 10-2011-0072399, filed on Jul. 21, 2011, in the Korean Intellectual Property Office, the disclosure of which is incorporated herein by reference.

BACKGROUND OF THE INVENTION

1. Field of the Invention

The present invention relates to an input device and an image display apparatus including the same and, more particularly, to an input device able to improve user convenience and an image display apparatus including the same.

2. Description of the Related Art

An image display apparatus has a function for displaying an image to a user and a function for outputting an audio signal.

In the image display apparatus, an input device is used to output a video or audio signal desired by a user or perform other setting functions.

SUMMARY OF THE INVENTION

Therefore, the present invention has been made in view of the above problems, and it is an object of the present invention to provide an input device able to improve user convenience and an image display apparatus including the same.

It is another object of the present invention to provide an input device able to provide an interactive effect during input and an image display apparatus including the same.

In accordance with an aspect of the present invention, the above and other objects can be accomplished by the provision of an image display apparatus comprising a display to display an image, and an input device adjacent to the display, the input device comprising a first light emitting device (LED) to emit a first light of a first color, a second light emitting device (LED) to emit a second light of a second color, a light guide to receive the first light from the first LED at a first end of the light guide and to receive the second light from the second LED at a second end of the light guide, the light guide to mix the first light and the second light and to output a third light having a third color based on the mixed first and second lights, a touch sensor to detect a touch input, and a light source controller to control an intensity of light from the light guide based on the touch input.

In accordance with another aspect of the present invention, there is provided an image display apparatus comprising a display to display an image, and an input device provided in a bezel area adjacent to the display, the input device comprising a first light emitting device (LED) to provide a first light having a first color, a second light emitting device (LED) to provide a second light having a second color, a light guide having the first LED at a first end of the light guide and the second LED at a second end of the light guide, the light guide to combine the first light from the first LED and the second light from the second LED and to provide a third light having a third color, a touch sensor to detect a touch input, and a controller to adjust the third light from the light guide based on a position of the touch input.

In accordance with a further aspect of the present invention, there is provided an input device comprising a first light emitting device (LED) to provide a first light having a first color, a second light emitting device (LED) to provide a second light having a second color, a light guide to receive the first light from the first LED at a first end of the light guide and to receive a second light from the second LED at a second end of the light guide, and the light guide to output a third light having a third color based on a combination of the first light and the second light, a touch sensor to determine a touch input, and a controller to control an intensity of the third light from the light guide based on the determined touch input.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Exemplary embodiments of the present invention will be described with reference to the attached drawings.

The terms "module" and "unit" attached to describe the names of components are used herein to help the understanding of the components and thus they should not be considered as having specific meanings or roles. Accordingly, the terms "module" and "unit" may be used interchangeably.

Figure 1:
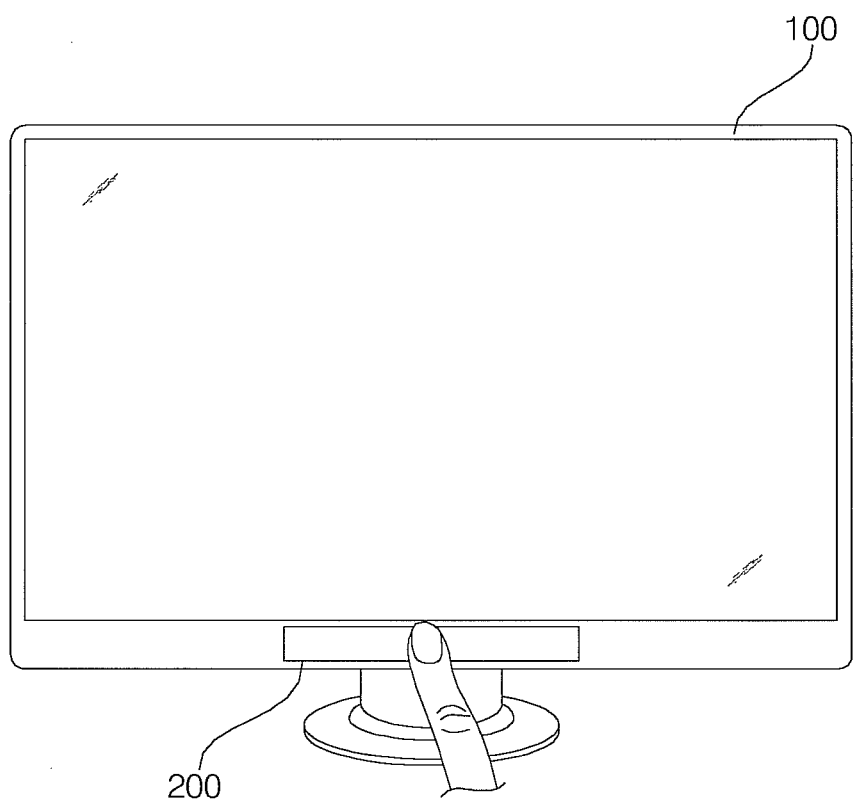
FIG. 1 is a diagram showing an image display apparatus including an input device according to an embodiment of the present invention.

FIG. 1 is a diagram showing an image display apparatus including an input device according to an embodiment of the present invention.

Referring to FIG. 1, the input device 200 according to the embodiment of the present invention may be included in the image display apparatus 100.

In FIG. 1, the input device 200 is arranged in at least a part of a bezel area surrounding a display 180 of the image display apparatus 100.

The input device 200 according to the embodiment of the present invention includes a plurality of light source units. The input device synthesizes light emitted from the light source units and outputs the synthesized light. In particular, if a user touch input is performed with respect to the input device 200, the light emitted from each light source unit is changed in correspondence with touch information of touch input.

For example, the amount of light emitted from at least one light source unit may be changed according to touch position information of the touch information. Therefore, it is possible to provide an interactive effect in correspondence with touch input.

As another example, the amount of light emitted from at least one light source unit may be changed according to touch number information, touch strength information or touch duration information of touch information. As another example, the color of light emitted from at least one light source unit may be changed according to touch number information, touch strength information or touch duration information of the touch information. Therefore, it is possible to provide an interactive effect in correspondence with touch input.

The input device 200 may include a plurality of input keys (not shown) for inputting various input operations. The plurality of input keys may be displayed on a substrate of the input device 200 by a printing method, etc. Touch input positions may correspond to the plurality of input keys. Therefore, different input operations may be performed according to touch input positions.

The operation of the input device will now be described.

The image display apparatus described in the present specification may include a TV receiver, a mobile phone, a smart phone, a notebook computer, a digital broadcast terminal, a Personal Digital Assistant (PDA), a Portable Multimedia Player (PMP), etc.

That is, the input device 200 according to the embodiment of the present invention is applicable to various image display apparatuses, as described above. The input device 200 is applicable to electronic apparatuses such as a washing machine, a refrigerator, an air conditioner, a cooker, a cleaner or an electric iron.

Figure 2:
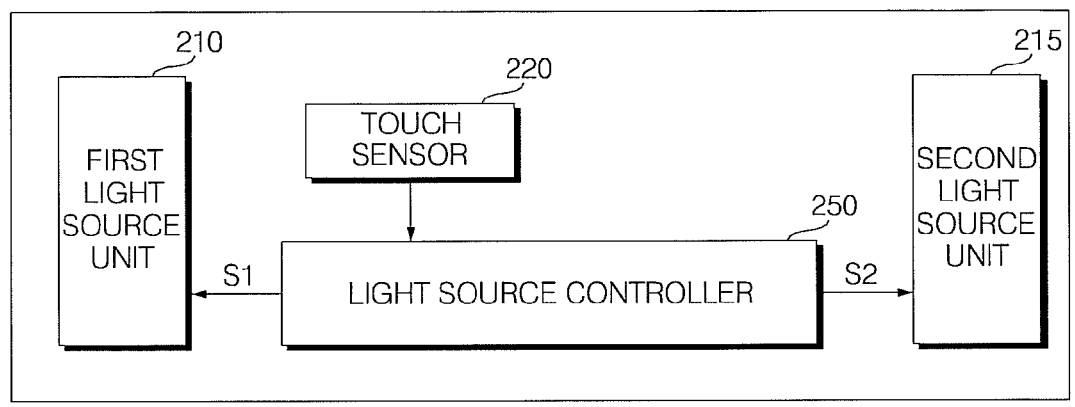
FIG. 2 is a block diagram showing an example of the input device of FIG. 1.

FIG. 2 is a block diagram showing an example of the input device of FIG. 1.

Referring to FIG. 2, the input device 200 according to the embodiment of the present invention includes a substrate 205, a first light source unit 210, a second light source unit 215, a touch sensor 220, a light guide 230, and a light source controller 250.

The first light source unit 210 and the second light source unit 215 are arranged spaced apart from each other and may emit respective light. The first light source unit 210 and the second light source unit 215 may emit light having the same color or different colors. Hereinafter, for convenience, it is assumed that the first light source unit 210 and the second light source unit 215 emit light having different colors.

The light guide 230 synthesizes the light emitted from the first light source unit 210 and the second light source unit 215 and outputs the synthesized light.

The light guide 230 may include at least one of a first direction pattern from the first light source unit 210 to the second light source unit 215 or a second direction pattern from the second light source unit 215 to the first light source unit 210. When a touch input is moved from the first light source unit 210 to the second light source unit 215, the amount of synthesized light is changed and the directivity of the light is increased, which will be described below with reference to FIGS. 17 and 18.

The touch sensor 220 detects a touch input. The detected touch information is sent to the light source controller 250. The detected touch information may include touch position information, touch number information, touch strength information or touch duration information.

Figure 4:
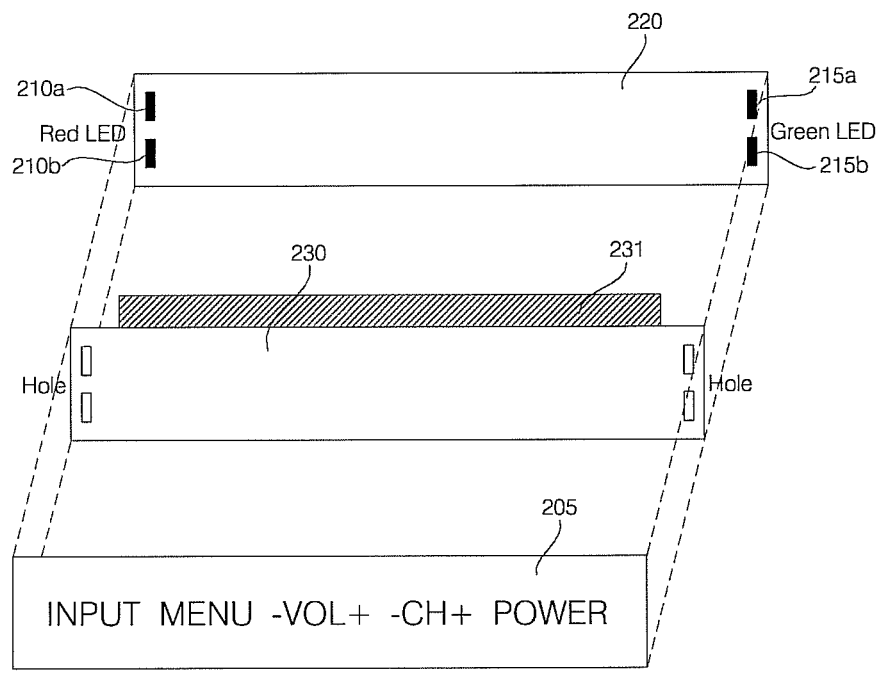
FIG. 4 is an exploded perspective view showing an example of the structure of the input device of FIG. 1.
Figure 6:
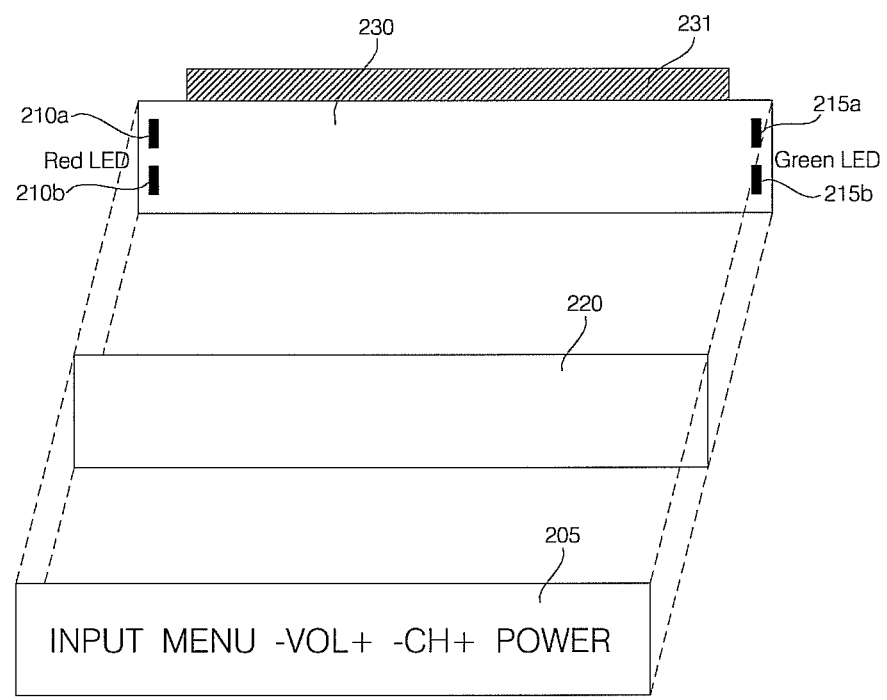
FIG. 6 is an exploded perspective view showing another example of the structure of the input device of FIG. 1.

The touch sensor 220 may be implemented using various methods such as a capacitive method or a static pressure method, in order to detect the user touch input. FIG. 4 shows a static pressure touch sensor and FIG. 6 shows a capacitive touch sensor.

The light source controller 250 controls the first light source unit 210 and the second light source unit 215. In particular, at least one of a first electrical signal S1 sent to the first light source unit 210 or a second electrical signal S2 sent to the second light source unit 215 is changed according to the touch information detected by the touch sensor 220.

For example, the light source controller 250 may increase the level or pulse width of the first electrical signal S1 and/or decrease the level or pulse width of the second electrical signal S2, as the touch position information of the touch information detected by the touch sensor 220 becomes closer to the second light source unit 215 than the first light source unit 210.

That is, the light source controller 250 may control increase in the amount of light emitted from the first light source unit 210 and/or decrease in the amount of light emitted from the second light source unit 215, as the touch position information of the touch information detected by the touch sensor 220 becomes closer to the second light source unit 215 than the first light source unit 210. By changing the amount of light in this way, the user can perceive an interactive effect corresponding to the touch input.

The light source controller 250 may change the amount of the light emitted from the first light source unit and the amount of light emitted from the second light source unit in inverse proportion to each other according to the touch position information of the touch information.

The light source controller 250 may change the level, pulse width or period of the first electrical signal S1 and/or the level, pulse width or period of the second electrical signal S2, according to the touch number information, touch strength information or touch duration information of the touch information detected by the touch sensor 220.

For example, the light source controller 250 may further increase the level or pulse width of the first electrical signal S1 and/or further decrease the level or pulse width of the second electrical signal S2, when the number of times of touch, the touch strength or the touch duration is increased in a state in which the touch position information of the detected touch information becomes closer to the second light source unit 215 than the first light source unit 210.

That is, the light source controller 250 may control increase of the amount of light emitted from the first light source unit 210 and/or decrease of the amount of light emitted from the second light source unit 215.

In particular, if the number of times of touch, the touch strength or the touch duration is increased, the light source controller 250 may control further increase of the amount of light emitted from the first light source unit 210 and/or further decrease of the amount of light emitted from the second light source unit 215. By changing the amount of light in this way, the user can perceive an interactive effect corresponding to the touch input.

As another example, the light source controller 250 may change at least one of the period of the first electrical signal S1 or the period of the second electrical signal S2, when the number of times of touch, the touch strength or the touch duration of the detected touch information is changed.

That is, the color of the light emitted from the first light source unit 210 and/or the color of the light emitted from the second light source unit 215 may be changed. By changing the color of the light, the user can perceive an interactive effect corresponding to the touch input.

The light source controller 250 may classify the touch information detected by the touch sensor 220 into touch position information, touch number information, touch strength information and touch duration information.

For example, the position information may be acquired based on a touch position information signal, the level of which is changed, of touch information signals detected by the touch sensor 220 or the touch number information, the touch strength information or the touch duration information may be acquired according to the number of pulses of the touch information signals detected by the touch sensor 220.

Figure 3:
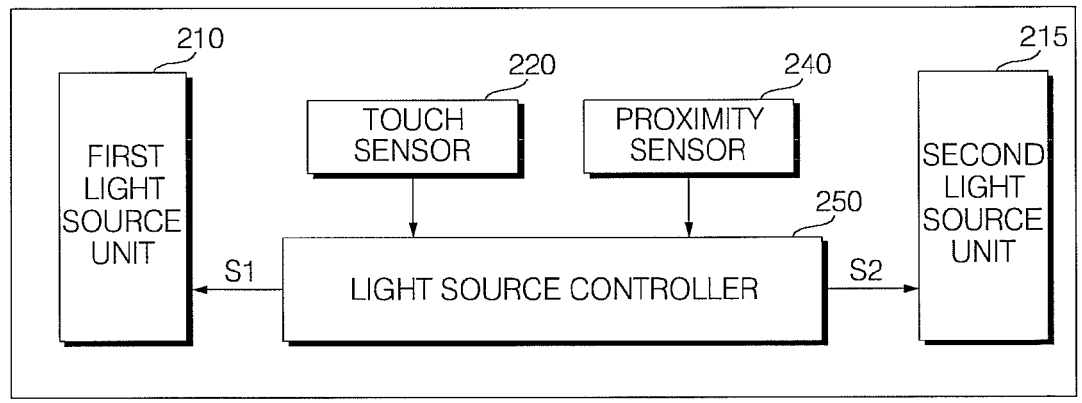
FIG. 3 is a block diagram showing another example of the input device of FIG. 1.

FIG. 3 is a block diagram showing another example of the input device of FIG. 1.

Referring to FIG. 3, the input device of FIG. 3 is different from the input device of FIG. 2 in that a proximity sensor 240 is further included. Hereinafter, only this difference will be described.

The proximity sensor 240 detects a user's finger which approaches the input device within a predetermined range and may be implemented using a sensor using light (photosensor, etc.), a high-frequency oscillator circuit, etc. The detected signal is input to the light source controller 250.

The light source controller 250 may control emission of light from at least one of the first light source unit 210 or the second light source unit 220, if it is determined that a user approaches the input device within a predetermined range.

That is, if the user does not approach the input device within the predetermined range, in order to reduce power consumption, the first light source unit 210 and the second light source unit 215 are in an idle state in which light is not emitted. Then, when the proximity sensor 240 detects that the user approaches the input device within the predetermined range, at least one of the first light source unit 210 and the second light source unit 215 emits light. Thereafter, the user may perform a touch input operation in a state in which the first light source unit 210 or the second light source unit 215 is activated.

Figure 5:
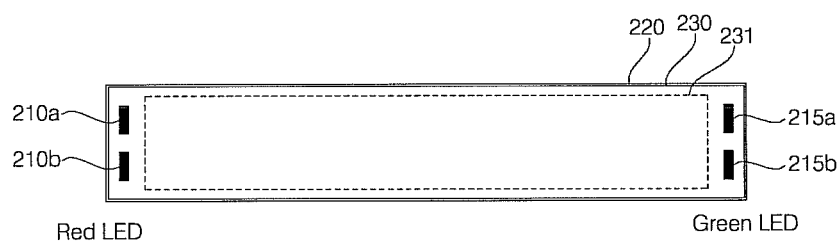
FIG. 5 is a diagram showing an example of a coupling structure of the input device of FIG. 1.

FIG. 4 is an exploded perspective view showing an example of the structure of the input device of FIG. 1, and FIG. 5 is a diagram showing an example of a coupling structure of the input device of FIG. 1.

Referring to FIGS. 4 and 5, the first light source unit 210 and the second light source unit 215 may be provided at both ends of the touch sensor 220 which may be implemented by a printed circuit board (PCB) and arranged spaced apart from each other.

The first light source unit 210 may emit a first light having a predetermined color. The second light source unit 215 may emit a second light having a color different that of the light emitted from the first light source unit 210.

Each of the light source units 210 and 215 may include a plurality of light sources for emitting light. For example, a light emitting diode (LED) may be used as a light source. The LED may be an inorganic LED or an organic LED.

The first light source unit 210 and the second light source unit 215 may include a plurality of light sources for emitting light having different colors, respectively. The light source units 210 and 215 may emit light having different colors according to conditions.

In FIG. 4, the first light source unit 210 includes a plurality of light sources 210a and 210b for emitting a red (R) light and the second light source unit 215 includes a plurality of light sources 215a and 215b for emitting a green (G) light.

Hereinafter, for convenience of description, it is assumed that the first light source unit 210 emits the red (R) light and the second light source unit 215 emits the green (G) light.

The touch sensor 220 may be disposed below the light guide 230. That is, the light guide 230 may be disposed below the substrate 205 and the touch sensor 220 may be disposed below the light guide 230. In particular, the first light source unit 210 and the second light source unit 215 may be disposed at both ends of the touch sensor 220.

The touch sensor 220 of FIG. 4 may be implemented by a static pressure method, in order to detect a user touch input. Touch information detected by the touch sensor 220 is sent to the light source controller 250.

The light guide 230 synthesizes the light emitted from the first light source unit 210 and the second light source unit 215 and outputs the synthesized light.

The light guide 230 couples the first light source unit 210 and the second light source unit 215 to holes corresponding to the first light source unit 210 and the second light source unit 215, directs the light of the first light source unit 210 to the second light source unit 215, and directs the light of the second light source unit 215 to the first light source unit 210.

FIG. 4 shows the case where the light guide 230 is disposed between the substrate 205 and the touch sensor 220 having the plurality of light source units 210 and 215 attached thereto. In particular, insertion holes may be formed in the light guide 230 so as to insert the red light source 210a and 210b and the green light sources 215a and 215b provided on both ends of the touch sensor 220 thereinto.

A reflection layer 231 may be disposed between the light guide 230 and the touch sensor 220 such that the synchronized light output from the light guide 230 is not directed to the touch sensor 220. By this reflection layer 231, the light synthesized by the light guide 230 may be output toward the substrate 205.

The light guide 230 may include at least one of a first direction pattern from the first light source unit 210 to the second light source unit 215 or a second direction pattern from the second light source unit 215 to the first light source unit 210. When a touch input is moved from the first light source unit 210 to the second light source unit 215, the amount of synthesized light is changed and the directivity of the light is improved, which will be described below with reference to FIGS. 17 and 18.

FIG. 5 shows the appearance of the input device 200 in which the substrate 205, the light guide 230 and the touch sensor 230 are sequentially connected, as shown in FIG. 4. The input device 200 may be implemented in the form of a module. The light source controller 250 and the proximity sensor 240 may be disposed on a rear surface of the touch sensor 230 implemented by a PCB.

The substrate 205 transmits and outputs the light synthesized by the light guide 230. In this case, the substrate 205 may be formed of a transparent material. For example, the substrate 205 may be formed of glass or a transparent film.

A plurality of input keys may be displayed on the substrate 205. For example, a plurality of input keys such as INPUT, MENU, −VOL, VOL+, −CH, CH+ and POWER may be displayed. More specifically, a plurality of input keys may be displayed on the transparent substrate 205 by a printing method, etc.

The input keys displayed on the substrate 205 are preferably displayed so as to be easily recognized from the synthesized light. The input keys displayed on the substrate may be variously changed.

As the touch input position becomes closer to the second light source units 215 than the first light source unit 210, the amount of light emitted from the first light source unit 210 is increased to be greater than the amount of light emitted from the second light source unit 215. Therefore, when the touch input position is moved, it is possible to provide a moving effect.

On the contrary to the above-described example, the light source controller 250 may further decrease the amount of light emitted from the first light source unit 210 or further increase the amount of light emitted from the second light source unit 215, as the touch input position becomes closer to the second light source unit 215 than the first light source unit 210. Therefore, when the touch input position is moved, it is possible to provide a moving effect.

FIG. 6 is an exploded perspective view showing another example of the structure of the input device of FIG. 1.

Referring to FIG. 6, the structure of the input device of FIG. 6 is similar to that of the input device of FIG. 5, except that the position of the touch sensor 220 is disposed between the substrate 205 and the light guide 230, unlike FIG. 5 in which the touch sensor 220 is disposed on the bottom of the input device. The reflection layer 231 may be attached to the rear surface of the light guide 230.

At this time, the first light source unit 210 and the second light source unit 215 may be disposed on the light guide 230 and, more particularly, on both ends of the light guide 230 and may be arranged spaced apart from each other.

The touch sensor 220 may be a capacitive touch sensor. The touch information detected by the touch sensor 220 is sent to the light source controller 240.

Unlike FIGS. 4 and 6, the position of the touch sensor 220 may be variously changed.

FIGS. 7 to 13 are diagrams showing various examples of light display according to touch input positions of the input device of FIG. 1.

Figure 7:
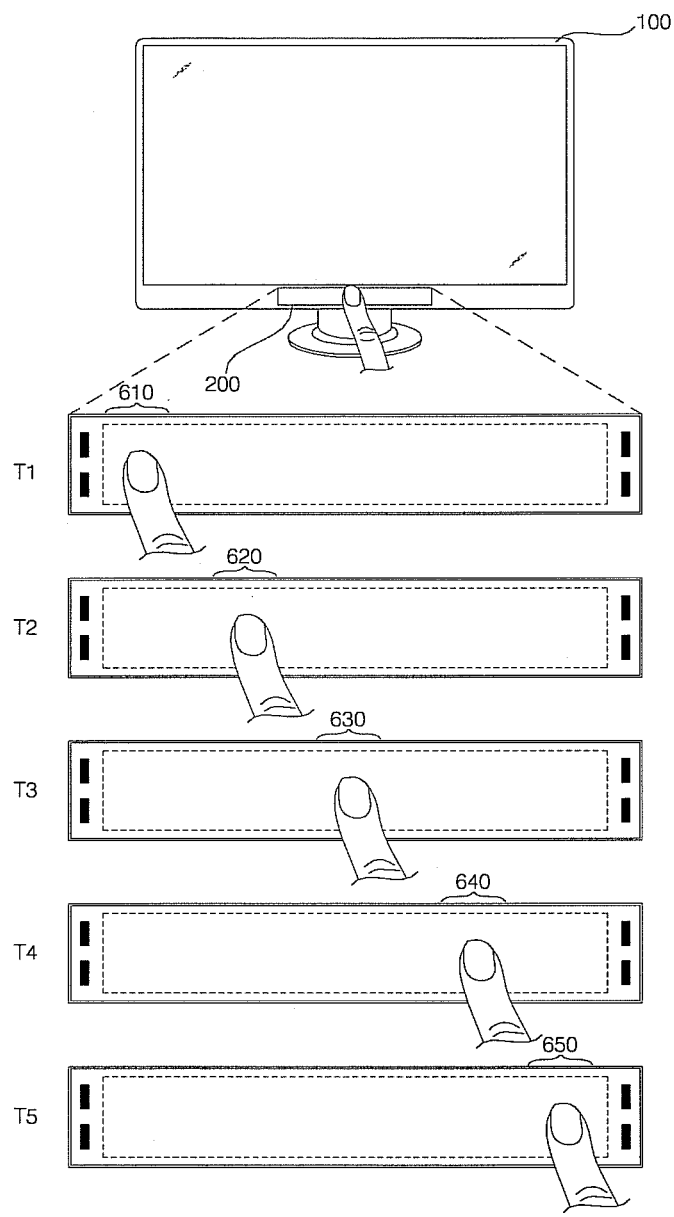
FIGS. 7 to 13 are diagrams showing various examples of light display according to touch input positions of the input device of FIG. 1.

First, referring to FIG. 7, the touch input position of the user's finger is located at a first position 610 close to the first light source unit 210 at a first time T1 and is then moved to a second position 620 from the first light source unit 210 toward the second light source unit 215 at a second time T2. Then, the touch input position is moved to a middle position 630 between the first light source unit 210 and the second light source unit 215 at a third time T3, is moved to a fourth position 640 close to the second light source unit 215 at a fourth time T4, and is moved to a fifth position 650 closer to the second light source unit 215 at a fifth time T5.

As shown in FIG. 7, the light source controller 250 controls the first light source unit 210 or the second light source unit 215 such that at least one of the amount of light emitted from the first light source unit 210 or the amount of light emitted from the second light source unit 215 is changed if the touch input position is changed.

Figure 8:

FIG. 8 shows the principle of synthesizing the light emitted from the first light source unit 210 and the light emitted from the second light source unit 215 according to the embodiment of the present invention.

In the embodiment of the present invention, in synthesis of red, green and blue light, the light synthesis principle of red+green=yellow, green+blue=cyan, red+blue=magenta and red+blue+green=white is used.

As described above, the first light source unit 210 emits the red light and the second light source unit 215 emits the green light. The light guide 220 guides the red light to the second light source unit 215 and guides the green light to the first light source unit 210. If the amount of light emitted from the first light source unit 210 and the amount of light emitted from the second light source unit 215 are identical, as shown in FIG. 8, a yellow light which is obtained by synthesizing the red light and the green light is displayed on the middle position 630 of the input device 200.

That is, the intensity of the red light emitted from the first light source unit 210 is gradually decreased toward the second light source unit 215 and the intensity of the green light emitted from the second light source unit 215 is gradually decreased toward the first light source unit 210 such that the yellow light is displayed on the middle position 630 of the input device 200.

Figure 9:
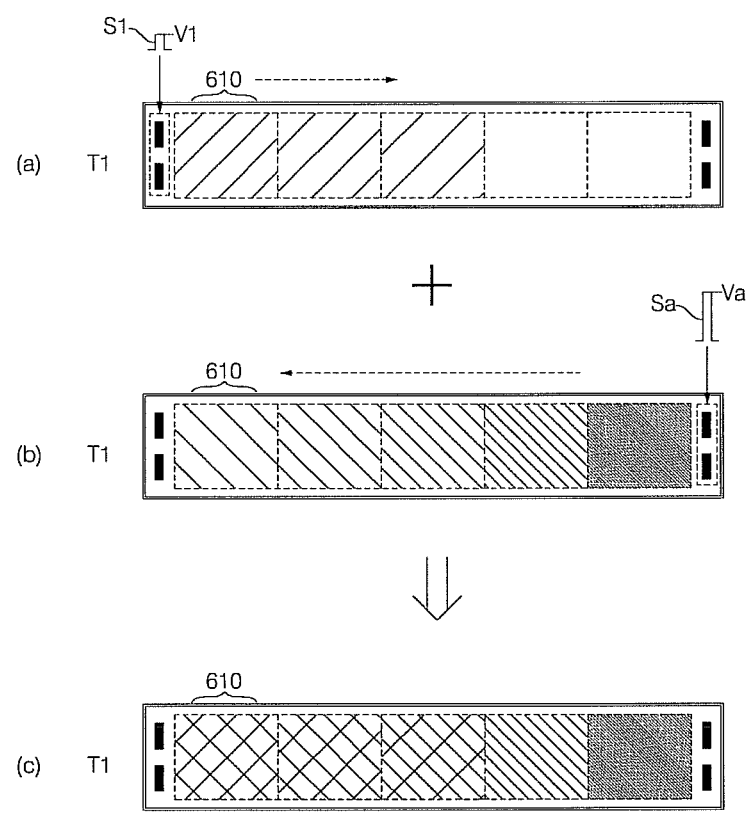

FIG. 9 shows light displayed on the input device 200 in correspondence with the first time T1 of FIG. 7.

Referring to FIG. 9, if the touch input position of the user's finger is the first position 610 at the first time T1, the amount of light emitted from the first light source unit 210 is decreased or the amount of light emitted from the second light source unit 215 such that the yellow light is displayed at the first position 610.

If the amount of light of each light source unit 210 or 215 is adjusted by a PAM method, the light source controller 250 may decrease the level of the signal input to the first light source unit 210 or increase the level of the signal input to the second light source unit 215.

If the amount of light of each light source unit 210 or 215 is adjusted by a PWM method, the light source controller 250 may decrease the pulse width of the signal input to the first light source unit 210 or increase the pulse width of the signal input to the second light source unit 215.

FIG. 9(a) shows the case where the first electrical signal S1 having a first level V1 is applied to the first light source unit 210 according to a PAM method such that the light emitted from the first light source unit 210 is directed to the second light source unit 215 via the light guide. The first level V1 may be a minimum level and the light emitted from the first light source unit 210 may be partially guided.

In FIG. 9(a), for convenience of description, the red light emitted from the first light source unit 210 is denoted by an oblique line having an angle of +45 degrees, and a gap between the oblique lines is gradually reduced toward the first light source unit 210.

FIG. 9(b) shows the case where the second electrical signal S2 having a predetermined level Va is applied to the second light source unit 215 according to a PAM method such that the light emitted from the second light source unit 215 is directed to the first light source unit 210 via the light guide. The predetermined level Va may be a maximum level and the amount of light emitted from the second light source unit 215 may be greater than the amount of light emitted from the first light source unit 210.

In FIG. 9(b), for convenience of description, the green light emitted from the first light source unit 210 is denoted by an oblique line having an angle of −45 degrees, and a gap between the oblique lines is gradually reduced toward the second light source unit 215.

FIG. 9(c) shows the case where the red light of FIG. 9(a) and the green light of FIG. 9(b) are synthesized. In particular, the position of the yellow light obtained by synthesizing the red light and the green light is the first position 610.

Figure 10:
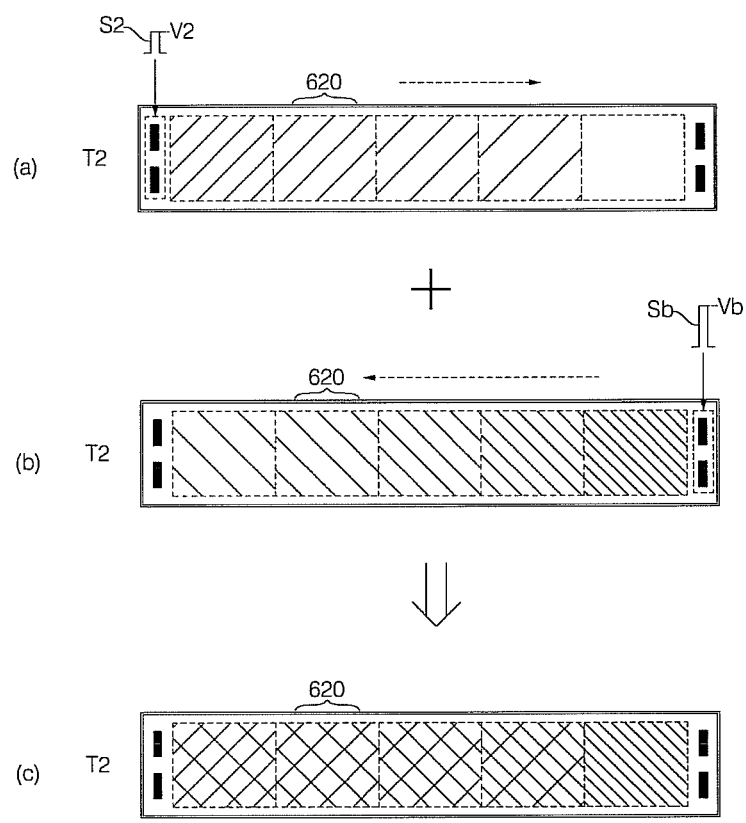

Next, FIG. 10 shows light displayed on the input device 200 in correspondence with the second time T2 of FIG. 7.

In comparison with FIG. 9, first, FIG. 10(a) shows the case where the first electrical signal S1 having a second level V2 is applied to the first light source unit 210 such that the light emitted from the first light source unit 210 is directed to the second light source unit 215 via the light guide. The second level is greater than the first level V1 of FIG. 9(a) and the amount of light emitted from the first light source unit 210 is increased as compared to FIG. 9.

FIG. 10(b) shows the case where the second electrical signal S2 having a predetermined level Vb is applied to the second light source unit 215 such that the light emitted from the second light source unit 215 is directed to the first light source unit 210 via the light guide. The predetermined level Vb is less than the level Va of FIG. 9(b) and the amount of light emitted from the second light source unit 215 is decreased as compared to FIG. 9.

FIG. 10(c) shows the case where the red light of FIG. 10(a) and the green light of FIG. 10(b) are synthesized. In particular, the position of the yellow light obtained by synthesizing the red light and the green light is the first position 620.

Figure 11:
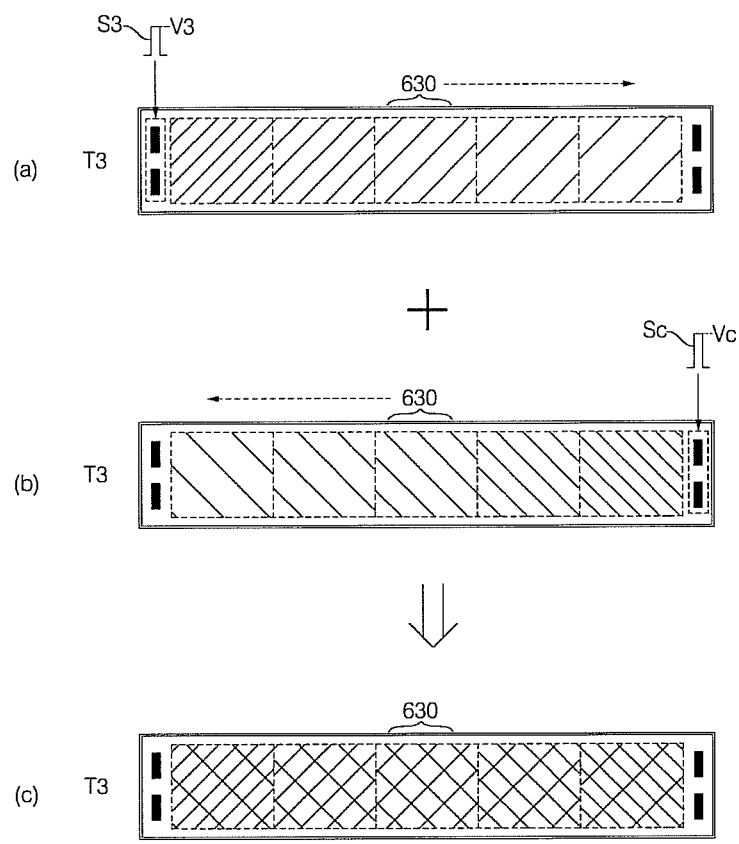
Figure 12:
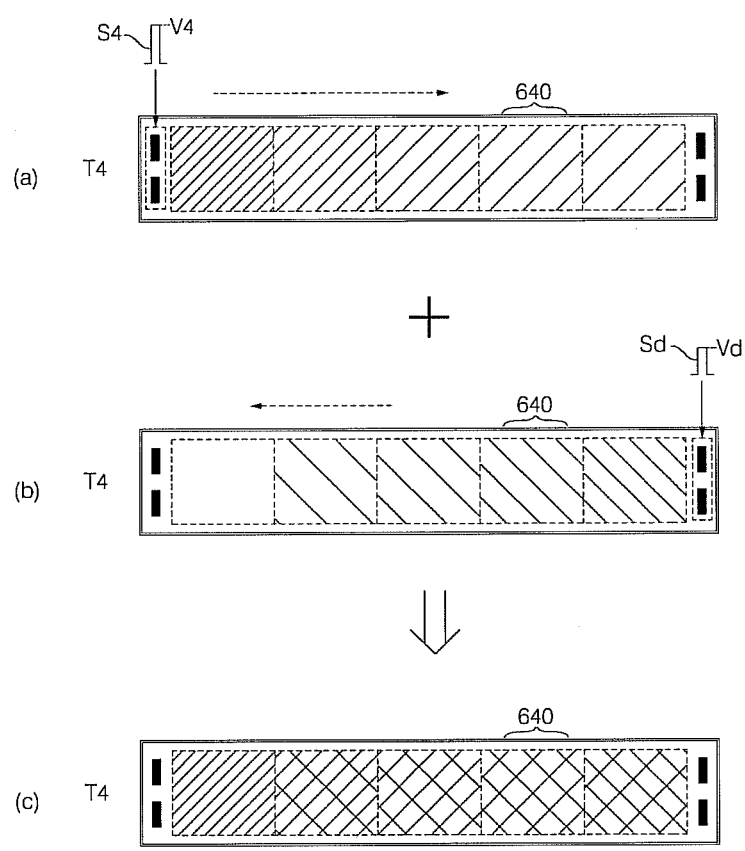
Figure 13:
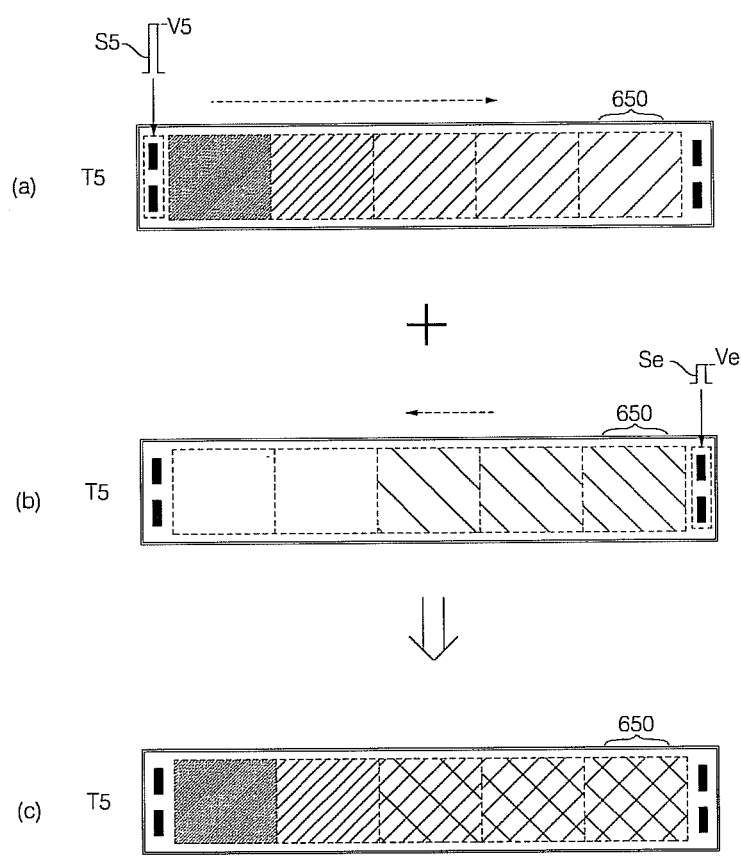

In this way, FIGS. 11 to 13 show the case where the amount of light is gradually increased as the level of the first electrical signal S1 input to the first light source unit 210 is gradually increased in order of V3, V4 and V5 and the amount of light is gradually decreased as the level of the second electrical signal S2 input to the second light source unit 215 is gradually decreased in order of Vc, Vd and Ve.

It can be seen that the position of the yellow light obtained by synthesizing the red light and the green light is changed in order of the third position 630, the fourth position 640 and the fifth position 650.

According to FIGS. 9 to 13, when the touch input position is moved, a moving effect or a gradation effect is generated by adjusting the amount of light. Therefore, the user perceives an interactive effect by touch input.

Although FIGS. 9 to 13 show the case where the touch input position moves from the left to the right, when the touch input position reversely moves from the right to the left, the amount of light may be reversely adjusted from the fifth time T5 to the first time T1.

If the touch input position is located at the first light source unit 210 or the second light source unit 215, the light source controller 250 may turn any one of the first light source unit 210 or the second light source unit 215 off.

For example, if the touch input position is located at the first light source unit 210, the light source controller 250 may supply an off signal to the first light source unit 210 such that the red light is not emitted from the first light source unit 210. At this time, the second light source unit 215 may emit the green light. Therefore, the light guide 230 may emit only the green light emitted from the second light source unit 215.

As another example, if the touch input position is located at the first light source unit 210, the light source controller 250 may supply an off signal to the second light source unit 215 such that the green light is not emitted from the second light source unit 215. At this time, the first light source unit 210 may emit the red light. Therefore, the light guide 230 may emit only the red light emitted from the first light source unit 210.

As another example, if the touch input position is located at the second light source unit 215, only the red light or the green light may be emitted.

If a plurality of input keys is displayed on the substrate 205, the light source controller 250 determines that an input key corresponding to a touch input position among the plurality of input keys is operated.

As described above, a plurality of input keys such as an input key, a menu key, a volume key, a channel key and a power key may be displayed on the substrate 205. If the touch input position is located at any one of the plurality of input keys, the light source controller 250 determines that an operation corresponding to the input key is performed. Thus, the light source controller sends a corresponding signal to a controller (170 of FIG. 23) of the image display apparatus 10 including the input device 200, which will be described below with reference to FIGS. 14 to 16.

Figure 14:
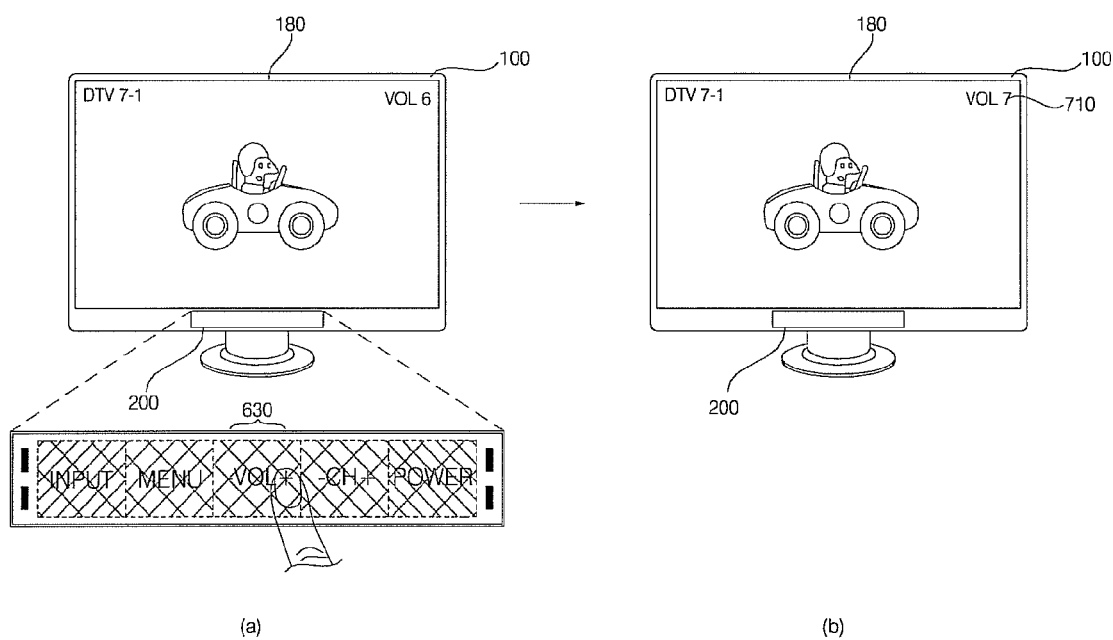
FIGS. 14 to 16 are diagrams showing various operation examples of the image display apparatus corresponding to touch input positions.
Figure 15:
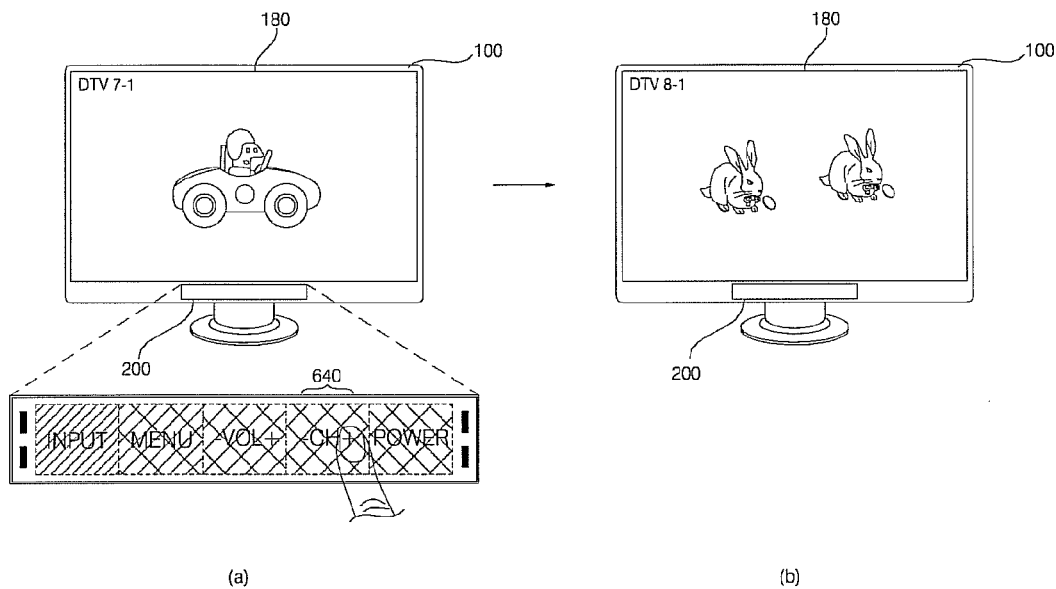
Figure 16:
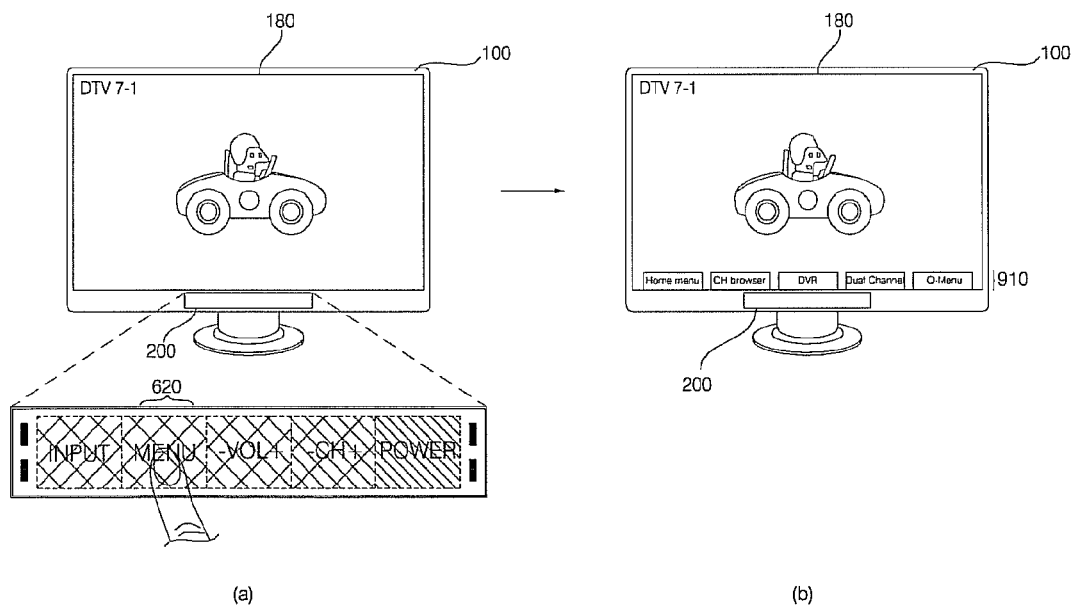

FIGS. 14 to 16 are diagrams showing various operation examples of the image display apparatus corresponding to touch input positions.

As described above, in a state in which a plurality of input keys such as an input key, a menu key, a volume key, a channel key and a power key is displayed on the substrate 205, as shown in FIG. 14(a), if the touch input position is located at the middle position 630 corresponding to the volume key and, more particularly, a Volume Up (VOL+) key of the volume key, as shown in FIG. 14(b), the audio volume of the image display apparatus 100 is increased. In FIG. 14, an object 701 representing Volume Up is shown.

Next, in a state in which the plurality of input keys is displayed on the substrate 205, as shown in FIG. 15(a), if the touch input position is located at the fourth position 640 corresponding to the channel key and, more particularly, a Channel Up (CH+) key of the channel key, as shown in FIG. 15(b), the channel of the image display apparatus 100 may be increased. In FIG. 15, the channel is increased from DTV 7-1 to DTV 8-1.

Next, in a state in which the plurality of input keys is displayed on the substrate 205, as shown in FIG. 16(a), if the touch input position is located at the second position 620 corresponding to the menu key, as shown in FIG. 16(b), a menu object 910 may be displayed on a display 180 of the image display apparatus 100. In FIG. 16, a menu object 910 representing a home menu item, a channel (CH) browser item, a DVR item, etc. is shown.

As another example of the menu object, if the image display apparatus 100 is a monitor, the menu object may include a brightness control item, a definition control item, an image quality control item, a horizontal position control item, a vertical position control item, an OSD language control item, etc.

It is possible to simply perform volume control, channel control, menu display, etc. corresponding to the touch input position while the synthesized light is emitted from the input device 200 according to the touch input position. Therefore, it is possible to increase user convenience. In addition, it is possible to perform a power on/off function of the image display apparatus 100.

Without separately providing a light source to each input key, the light corresponding to each input key is displayed using the light source units 210 and 215 located at both ends of the input device 200, thereby reducing manufacturing costs.

Figure 17:
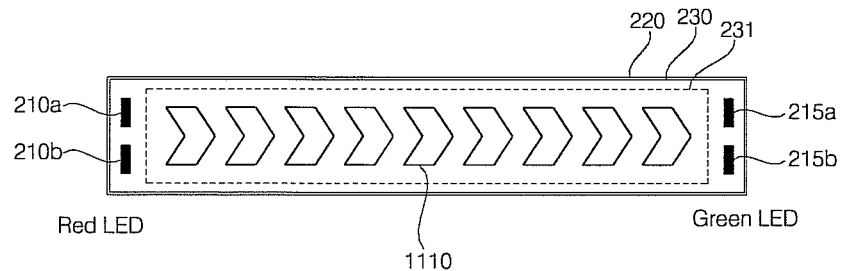
FIG. 17 is a diagram showing another example of a coupling structure of the input device of FIG. 1.
Figure 18:
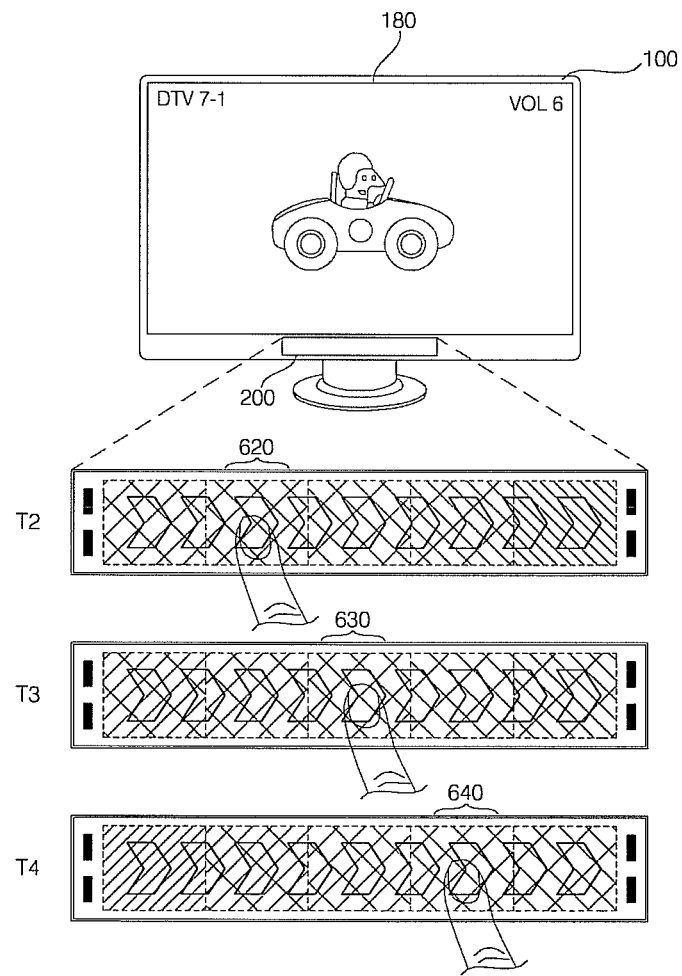
FIG. 18 is a diagram showing various examples of light display according to touch input positions of the input device of FIG. 17.

FIG. 17 is a diagram showing another example of a coupling structure of the input device of FIG. 1, and FIG. 18 is a diagram showing various examples of light display according to touch input positions of the input device of FIG. 17.

Referring to FIG. 17, the light guide 230 may include at least one of a first direction pattern from the first light source unit 210 to the second light source unit 215 or a second direction pattern from the second light source unit 215 to the first light source unit 210.

In FIG. 17, a plurality of first direction patterns 1110 from the first light source unit 210 to the second light source unit 215 is formed. The first direction patterns 1110 may be formed on the light guide 230 in a groove shape or an insertion shape.

Unlike FIG. 17, the first direction patterns may be formed on the substrate 205. More specifically, the first direction patterns may be formed on a lower surface of the substrate 205 which is in contact with the light guide 230.

As shown in FIG. 18, when the touch input position is moved from the second position 620 to the fourth position 640 through the third position 630, the amount of light emitted from the first light source unit 210 is changed, the amount of light emitted from the second light source unit 215 is changed, the light obtained by synthesizing the light emitted from the first and second light source units is changed, and the directivity of the light is increased by the first direction patterns 1110. Accordingly, it is possible to increase the interactive effect.

FIGS. 19 to 22 are diagrams showing various examples of light display according to touch input strength of the input device of FIG. 1.

In each of the input devices of FIGS. 19 to 22, each of the first light source unit 210 and the second light source unit 215 includes a plurality of light sources for emitting light having different colors.

That is, the first light source unit 210 may include a red light source, a green light source and a blue light source. The second light source unit 215 may include a green light source, a blue light source and a red light source.

Figure 19:
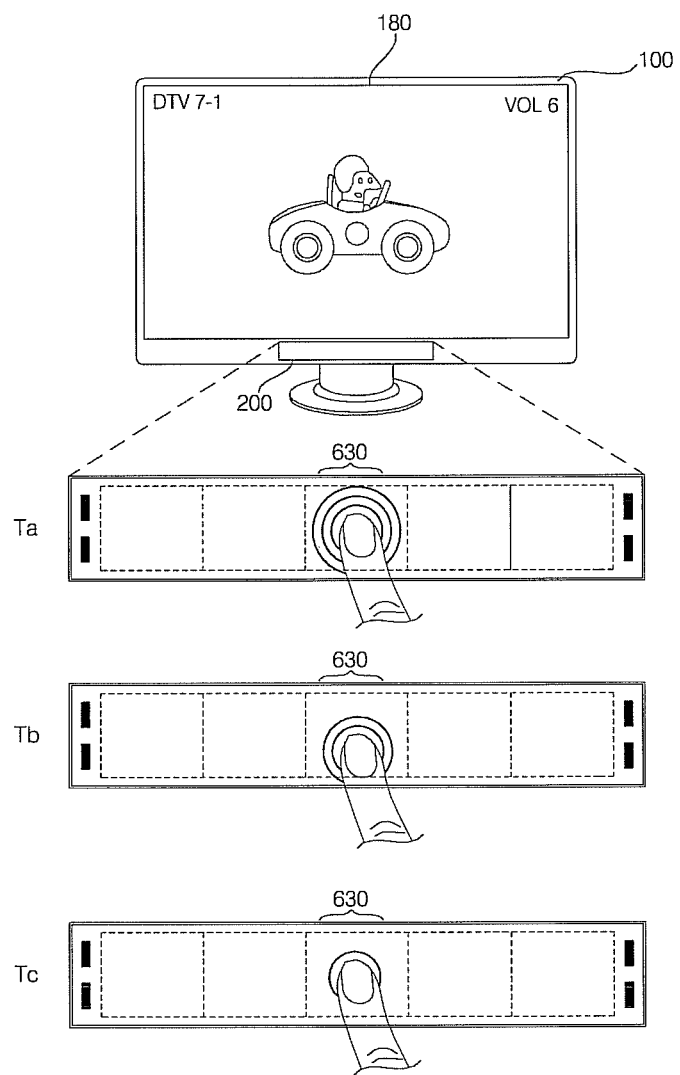
FIGS. 19 to 22 are diagrams showing various examples of light display according to touch input strength of the input device of FIG. 1.
Figure 20:
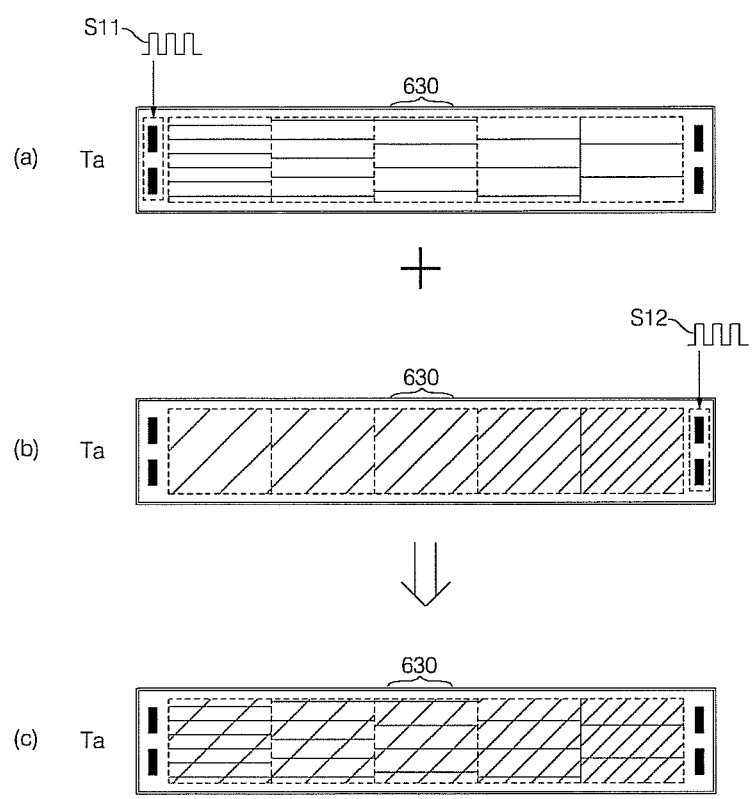

First, at a time Ta of FIG. 19, if the strength of the touch input is highest (corresponding to three-time touch) in a state in which the touch input position is located at the middle position 630, as shown in FIG. 20, the first light source unit 210 may emit the blue light and the second light source unit 215 may emit the red light.

FIG. 20(a) shows the case of applying a first electrical signal S11 having three pulses to the first light source unit 210 according to the strength of the touch input. Then, the blue light is emitted from the first light source unit 210 and is directed to the second light source unit 215 through the light guide. In FIG. 20, the blue light is denoted by a horizontal line.

FIG. 20(b) shows the case of applying a second electrical signal S12 having three pulses to the second light source unit 215 according to the strength of the touch input. Then, the red light is emitted from the second light source unit 215 and is directed to the first light source unit 210 through the light guide. In FIG. 20, the red light is denoted by an oblique line having an angle of +45 degrees.

FIG. 20(c) shows the case of synthesizing the blue light of FIG. 20(a) and the red light of FIG. 20(b). In particular, a magenta light may be displayed at the middle position 630.

If the touch input position is changed, similarly to FIG. 7, at least one of the amount of blue light emitted from the first light source unit 210 or the amount of red light emitted from the second light source unit 215 is changed.

Figure 21:
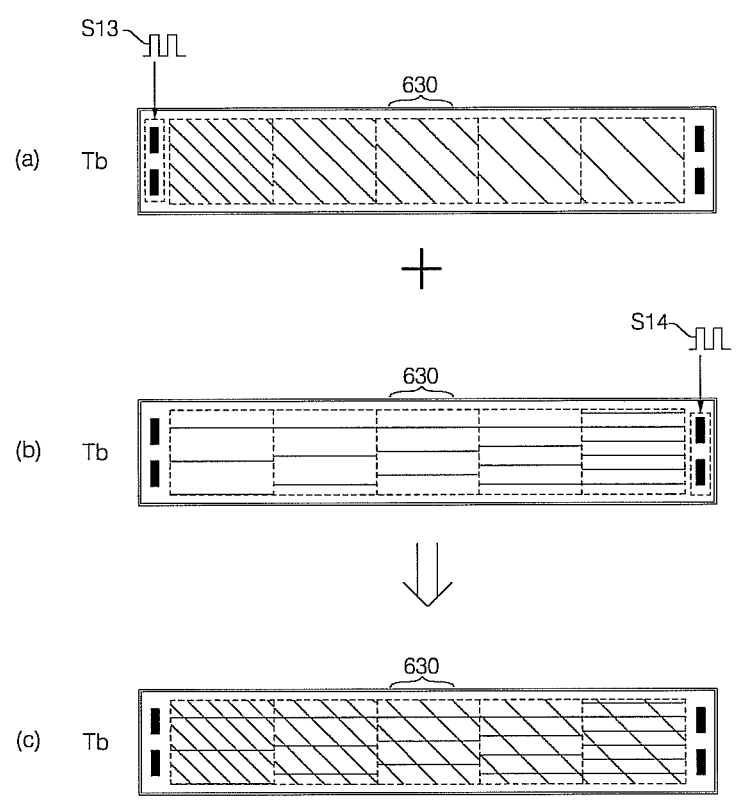

Next, at a time Tb of FIG. 19, if the strength of the touch input is middle (corresponding to two-time touch) in a state in which the touch input position is located at the middle position 630, as shown in FIG. 21, the first light source unit 210 may emit the green light and the second light source unit 215 may emit the blue light.

FIG. 21(a) shows the case of applying a first electrical signal S13 having two pulses to the first light source unit 210 according to the strength of the touch input. Then, the green light is emitted from the first light source unit 210 and is directed to the second light source unit 215 through the light guide. In FIG. 21, the green light is denoted by an oblique line having an angle of −45 degrees.

FIG. 21(b) shows the case of applying a second electrical signal S14 having two pulses to the second light source unit 215 according to the strength of the touch input. Then, the blue light is emitted from the second light source unit 215 and is directed to the first light source unit 210 through the light guide. In FIG. 21, the blue light is denoted by a horizontal line.

FIG. 21(c) shows the case of synthesizing the green light of FIG. 21(a) and the blue light of FIG. 21(b). In particular, a cyan light may be displayed at the middle position 630.

Figure 22:
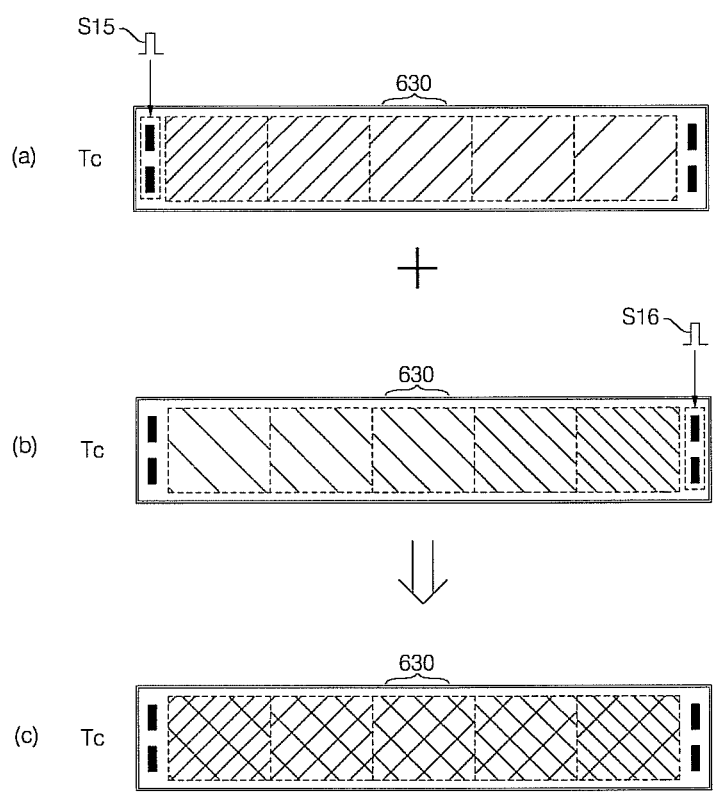

Next, at a time Tc of FIG. 19, if the strength of the touch input is lowest (corresponding to one-time touch) in a state in which the touch input position is located at the middle position 630, as shown in FIG. 22, the first light source unit 210 may emit the red light and the second light source unit 215 may emit the green light.

FIG. 22(a) shows the case of applying a first electrical signal S15 having one pulse to the first light source unit 210 according to the strength of the touch input. Then, the red light is emitted from the first light source unit 210 and is directed to the second light source unit 215 through the light guide. In FIG. 22, the red light is denoted by an oblique line having an angle of +45 degrees.

FIG. 22(b) shows the case of applying a second electrical signal S16 having one pulse to the second light source unit 215 according to the strength of the touch input. Then, the green light is emitted from the second light source unit 215 and is directed to the first light source unit 210 through the light guide. In FIG. 22, the green light is denoted by an oblique line having an angle of −45 degrees.

FIG. 22(c) shows the case of synthesizing the red light of FIG. 22(a) and the green light of FIG. 22(b). In particular, a yellow light may be displayed at the middle position 630.

Therefore, by changing at least one of the color of the light emitted from the first light source unit or the color of the light emitted from the second light source unit, it is possible to variously implement the interactive effect during touch input.

Figure 23:
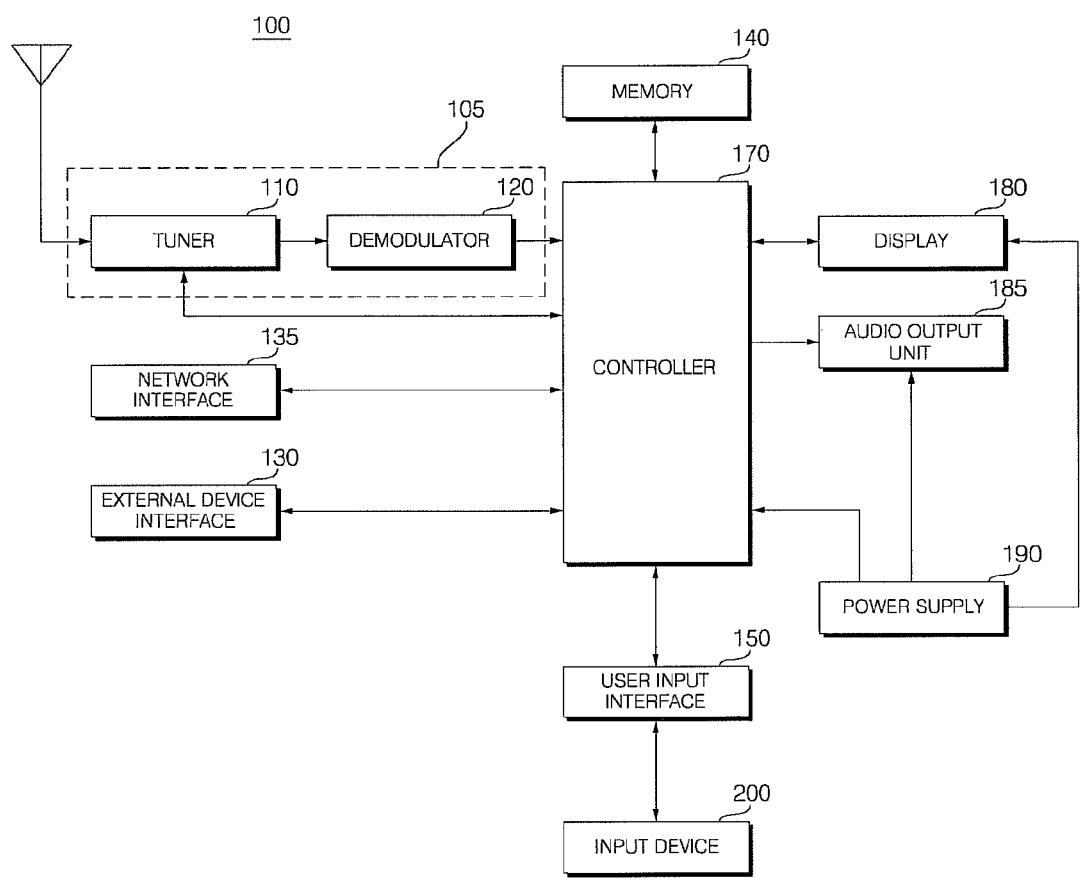
FIG. 23 is a block diagram of the image display apparatus of FIG. 1.

FIG. 23 is a block diagram of the image display apparatus of FIG. 1.

Referring to FIG. 23, the image display apparatus according to the embodiment of the present invention may be a broadcast display apparatus.

The image display apparatus 100 may include a broadcast receiver 105, an external device interface 130, a network interface 135, a memory 140, a user input interface 150, a controller 170, a display 180, an audio output unit 185, a power supply 190 and an input device 200.

The broadcast receiver 105 may include a tuner 110, a demodulator 120 and a network interface 135. As needed, only the tuner 110 and the demodulator may be included or only the network interface 135 may be included.

The tuner 110 tunes to a Radio Frequency (RF) broadcast signal corresponding to a channel selected by a user from among RF broadcast signals received through an antenna or RF broadcast signals corresponding to all channels previously stored in the image display apparatus. The tuned RF broadcast is converted into an Intermediate Frequency (IF) signal or a baseband Audio/Video (AV) signal.

The demodulator 120 receives the digital IF signal DIF from the tuner 110 and demodulates the digital IF signal DIF.

The demodulator 120 may perform demodulation and channel decoding, thereby obtaining a stream signal. The stream signal may be a signal in which a video signal, an audio signal and a data signal are multiplexed.

The stream signal output from the demodulator 120 may be input to the controller 170 and thus subjected to demultiplexing and A/V signal processing. The processed video and audio signals are output to the display 180 and the audio output unit 185, respectively.

The external device interface 130 may serve as an interface between an external device and the image display apparatus 100. For interfacing, the external device interface 130 may include an A/V Input/Output (I/O) unit (not shown) and/or a wireless communication module (not shown).

The network interface 135 serves as an interface between the image display apparatus 100 and a wired/wireless network such as the Internet. The network interface 135 may receive content or data provided by an Internet or content provider or a network operator over a network.

The memory 140 may store various programs necessary for the controller 170 to process and control signals, and may also store processed video, audio and data signals.

The memory 140 may temporarily store a video, audio and/or data signal received from the external device interface 130. The memory 140 may store information about a predetermined broadcast channel by the channel storage function.

The user input interface 150 transmits a signal input by the user to the controller 170 or transmits a signal received from the controller 170 to the user.

The input device 200 may synthesize the light emitted from the first light source unit and the light emitted from the second light source unit so as to output the synthesized light and change and output at least one of the amount of light emitted from the first light source unit or the second light source unit according to the touch input position.

The input device 200 may output the light such that the amount of light emitted from the first light source unit and the amount of light emitted from the second light source unit are inversely proportional to each other according to the touch input position.

The input device 200 may change at least one of the amount of light emitted from the first light source unit or the amount of light emitted from the second light source unit according to the number of times of touch input or the strength of the touch input.

The input device 200 may change at least one of the color of the light emitted from the first light source unit or the color of the light emitted from the second light source unit according to the number of times of touch input or the strength of the touch input.

The touch input position information, the touch input number information or the touch input strength information of the input device 200 may be input to the controller 170 through the user input interface 150.

The input device 200 according to the embodiment of the present invention may be any one of the input devices described with reference to FIGS. 1 to 22, which will be omitted herein.

The controller 170 may perform an operation corresponding to the touch input from the input device 200.

For example, in a state in which a plurality of input keys such as an input key, a menu key, a volume key, a channel key and a power key is displayed on the substrate 205, the volume may be controlled as shown in FIG. 14, the channel may be controlled as shown in FIG. 15, or the menu object may be displayed as shown in FIG. 16. In addition, the power on/off operation of the image display apparatus 100 may be performed.

The controller 170 may control the display of an object corresponding to a touch input position. The object 710 representing Volume Up may be displayed on the display 180 as shown in FIG. 14 or the menu object 910 may be displayed as shown in FIG. 16. Therefore, the user can confirm the operation associated with the input device 200 through the display 180.

If the image display apparatus 100 is a monitor, the controller 170 may control the display of the menu object including a brightness control item, a definition control item, an image quality control item, a horizontal position control item, a vertical position control item, an OSD language control item, etc.

The controller 170 may demultiplex the stream signal received from the tuner 110, the demodulator 120, or the external device interface 130 into a number of signals, process the demultiplexed signals into audio and video data, and output the audio and video data.

The video signal processed by the controller 170 may be displayed as an image on the display 180. The video signal processed by the controller 170 may also be transmitted to an external output device through the external device interface 130.

The audio signal processed by the controller 170 may be output to the audio output unit 185. Also, the audio signal processed by the controller 170 may be transmitted to the external output device through the external device interface 130.

While not shown in FIG. 23, the controller 170 may include a DEMUX, a video processor, etc., which will be described below with reference to FIG. 24.

The display 180 converts the video signal, the data signal, the OSD signal and the control signal processed by the controller 170 or the video signal, the data signal and the control signal received by the external device interface 130 and generates a driving signal.

The display 180 may be a projector, a Plasma Display Panel (PDP), a Liquid Crystal Display (LCD), an Organic Light-Emitting Diode (OLED) display or a flexible display. In particular, in the embodiment of the present invention, the display 180 may be a 3D display.

The audio output unit 185 receives the audio signal processed by the controller 170 and outputs the received audio signal as sound.

The power supply 190 supplies power to the image display apparatus 100. Particularly, the power supply 190 may supply power to the controller 170 which may be implemented as a System On Chip (SOC), the display 180 for displaying the video signal, and the audio output unit 185 for outputting the audio signal.

The power supply 190 may include a converter (not shown) for converting an AC voltage into a DC voltage. The power supply 190 may further include a DC/DC converter for changing the level of the DC voltage and outputting the DC voltage with the changed level.

The block diagram of the image display apparatus 100 shown in FIG. 23 is an embodiment of the present invention. Some of the components of the block diagram of FIG. 23 may be combined or omitted and new components may be added to the block diagram of FIG. 23.

The image display apparatus 100 according to one embodiment of the present invention may be an image display apparatus without a broadcast reception function, e.g., a monitor. In this case, the above-described broadcast receiver 105 may not be included.

Figure 24:
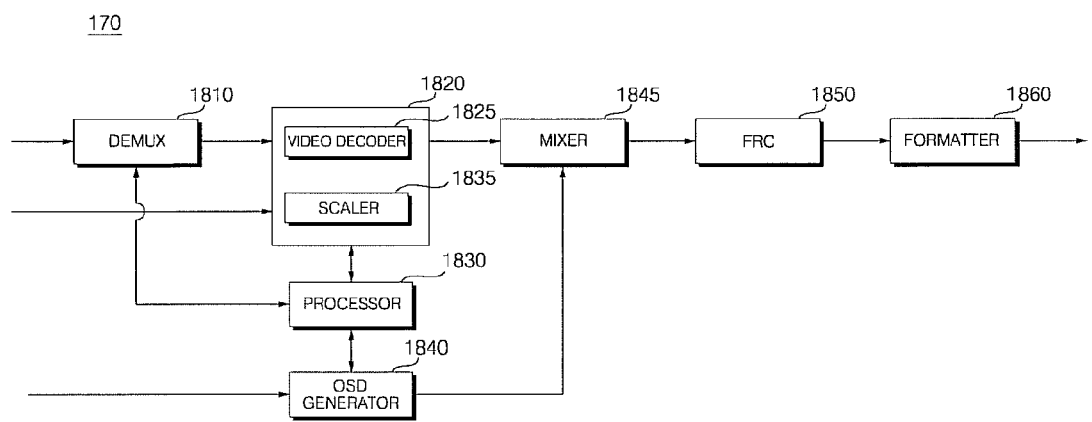
FIG. 24 is a block diagram of a controller of FIG. 23.

FIG. 24 is a block diagram of the controller of FIG. 23.

Referring to FIG. 24, the controller 170 according to one embodiment of the present invention includes a DEMUX 1810, a video processor 1820, a processor 1830, an OSD generator 1840, a mixer 1845, a frame rate converter (FRC) 1850, and a formatter 1860. The controller 170 may further include an audio processor (not shown) and a data processor (not shown).

The DEMUX 1810 demultiplexes an input stream into a video signal, an audio signal, and a data signal. The stream signal input to the DEMUX 1810 may be received from the tuner 110, the demodulator 120 or the external device interface 135.

The video processor 1820 may process the demultiplexed video signal. For video signal processing, the video processor 1820 may include a video decoder 1825 and a scaler 1835.

The video decoder 1825 decodes the demultiplexed video signal and the scaler 1835 scales the resolution of the decoded video signal so that the video signal can be displayed on the display 180.

The video decoder 1825 may be provided with decoders that operate based on various standards.

The processor 1830 may control the overall operation of the image display apparatus 100 or the controller 170. For example, the processor 1830 controls the tuner 110 to tune to a channel selected by the user and controls the image display apparatus 100 by a user command input through the user input interface 150 or an internal program.

The processor 1830 may control the operations of the DEMUX 1810, the video processor 1820 and the OSD generator 1840 of the controller 170.

The OSD generator 1840 generates an OSD signal autonomously or according to user input. For example, the OSD generator 1840 may generate signals, by which a variety of information is displayed as images or text on the screen of the display 180, according to a user input signal received through the input device 200. The OSD signal may include various data such as a UI, a variety of menu screens, widgets, icons, etc. of the image display apparatus 100.

The mixer 1845 may mix the decoded video signal processed by the video processor 1820 with the OSD signal generated by the OSD generator 1840 and output the mixed signal to the FRC 1850.

The FRC 1850 may change the frame rate of an input image. The FRC 1850 may maintain the frame rate of the input image without frame rate conversion.

The formatter 1860 receives the mixed signal from the mixer 1845, that is, the OSD signal and the decoded video signal, changes the format of the mixed signal to be suitable for the display 180. For example, the formatter 1860 may convert a received signal into an RGB data signal. The RGB signal may be output in the form of a Low Voltage Differential Signal (LVDS) or mini-LVDS.

The formatter 1860 may divide the video signal into a 2D image signal and a 3D video signal, for 3D video display. The formatter 1860 may change the format of the 3D video signal or convert a 2D video signal into a 3D video signal.

The audio processor (not shown) of the controller 170 may process the demultiplexed audio signal. For audio signal processing, the audio processor (not shown) may have a plurality of decoders.

The audio processor (not shown) of the controller 170 may also adjust the bass, treble or volume of the audio signal.

The data processor (not shown) of the controller 170 may process the demultiplexed data signal. For example, if the demultiplexed data signal is an encoded signal, the controller 170 may decode the data signal. The encoded data signal may be an EPG which includes broadcasting information specifying the start time, end time, etc. of scheduled broadcast programs.

The block diagram of the controller 170 illustrated in FIG. 4 is an embodiment of the present invention. Depending upon the specifications of the controller 170, the components of the controller 170 may be combined, or omitted. Or new components are added to the controller 170.

In particular, the FRC 1850 and the formatter 1860 may not be included in the controller 170 and may be separately provided or omitted.

Figure 25:
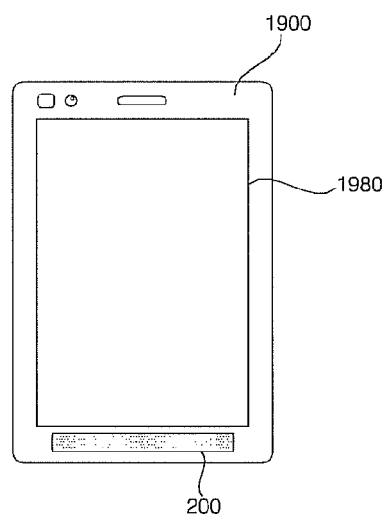
FIG. 25 is a diagram showing an image display apparatus including an input device according to another embodiment of the present invention.

FIG. 25 is a diagram showing an image display apparatus including an input device according to another embodiment of the present invention.

Referring to FIG. 25, the image display apparatus 1900 of FIG. 25 may be a mobile terminal including a display 1980 and an input device 200. For example, the mobile terminal 1900 may be a mobile phone, a PMP, an e-book, an MP3 player, a music player, etc.

As described above, the input devices 200 described with reference to FIGS. 1 to 22 are applicable to a mobile terminal. Thus, even in the mobile terminal, it is possible to increase an interactive effect by adjusting the amount of light according to a touch input position.

According to the embodiments of the present invention, if a touch input is performed between first and second light source units arranged spaced apart from each other, at least one of a first electrical signal sent to the first light source unit or a second electrical signal sent to the second light source unit is changed according to touch information such that at least one of the amount of light emitted from the first light source unit or the amount of light emitted from the second light source unit is changed. That is, it is possible to provide an interactive effect during the touch input. Accordingly, it is possible to improve user convenience.

That is, by changing the amount of light emitted from the first light source unit and the amount of light emitted from the second light source unit in inverse proportion to each other according to the touch position information of the touch information, it is possible to increase an interactive effect.

By changing at least one of the amount of light emitted from the first light source unit or the amount of light emitted from the second light source unit according to touch number information, touch strength information or touch duration information of the touch information, it is possible to implement various feedback effects.

By changing at least one of the color of light emitted from the first light source unit or the color of light emitted from the second light source unit according to the touch number information, touch strength information or touch duration information of the touch information, it is possible to implement various interactive effects during the touch input.

By operating an input key corresponding to a touch input position among a plurality of input keys displayed on a substrate, it is possible to simply implement the input key.

An image display apparatus including an input device according to an embodiment of the present invention displays an object corresponding to a touch input position so as to variously implement a menu configuration according to the position.

As a result, in the image display apparatus including the input device according to the embodiment of the present invention, it is possible to provide various user interfaces and increase user convenience.

The input device and the image display apparatus according to the present invention may be implemented as code that can be written to a computer-readable recording medium and can thus be read by a processor included in an image display device. The computer-readable recording medium may be any type of recording device in which data can be stored in a computer-readable manner. Examples of the computer-readable recording medium include a ROM, a RAM, a CD-ROM, a magnetic tape, a floppy disc, an optical data storage, and a carrier wave (e.g., data transmission over the Internet). The computer-readable recording medium can be distributed over a plurality of computer systems connected to a network so that computer-readable code is written thereto and executed therefrom in a decentralized manner. Functional programs, code, and code segments needed for realizing the embodiments herein can be construed by one of ordinary skill in the art.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An image display apparatus comprising:
    a display to display an image; and
    an input device adjacent to the display, the input device comprising:
        a touch sensor to detect a touch input,
        a first light emitting device (LED) to emit a first light of a first color and arranged at a first end of the touch sensor,
        a second light emitting device (LED) to emit a second light of a second color and arranged at a second end of the touch sensor,
        a substrate formed of a transparent material, and a plurality of input keys to be displayed on the transparent substrate,
        a light guide to receive the first light from the first LED at a first end of the light guide and to receive the second light from the second LED at a second end of the light guide, the light guide to mix the first light and the second light and to output a third light having a third color based on the mixed first and second lights, and the light guide being disposed below the substrate,
        a proximity sensor to detect a user's finger that approaches the input device within the predetermined range,
        a reflection layer disposed between the light guide and the touch sensor, and
        a light source controller to control an emission of light from at least one of the first light emitting device or the second light emitting device in an active state, when the proximity sensor detects that the user approaches the input device within the predetermined range in an idle state in which light is not emitted, and the controller to control an intensity of light from the light guide based on the touch input, and
    wherein the third color of the third light is a color corresponding to each of the input keys,
    wherein the light source controller increases an amount of the first light emitted from the first LED when the detected touch input is closer to the second LED than the first LED,
    wherein the light source controller decreases an amount of the second light emitted from the second LED when the detected touch input is closer to the second LED than the first LED,
    wherein the light source controller controls the intensity of the third light from the light guide based on a number of touches of the touch input,
    wherein the light guide is between the substrate and the touch sensor,
    wherein the input device is provided in a bezel area of the apparatus adjacent to the display.

2. The apparatus according to claim 1, wherein the light source controller controls the intensity of the third light from the light guide based on a position of the touch input.

3. The apparatus according to claim 1, wherein the light source controller controls the intensity of the third light from the light guide based on a duration of the touch input.

4. An image display apparatus comprising:
    a display to display an image; and
    an input device provided in a bezel area adjacent to the display, the input device comprising:
        a touch sensor to detect a touch input,
        a first light emitting device (LED) to provide a first light having a first color and arranged at a first end of the touch sensor,
        a second light emitting device (LED) to provide a second light having a second color and arranged at a second end of the touch sensor,
        a substrate formed of a transparent material, and to display a plurality of input keys on the transparent substrate,
        a light guide having the first LED at a first end of the light guide and the second LED at a second end of the light guide, the light guide to combine the first light from the first LED and the second light from the second LED and to provide a third light having a third color, and the light guide disposed below the substrate,
        a proximity sensor to detect a user's finger that approaches the input device within a predetermined range,
        a reflection layer disposed between the light guide and the touch sensor, and
        a controller to control an emission of light from at least one of the first light emitting device or the second light emitting device in an active state, when the proximity sensor detects that the user approaches the input device within the predetermined range in an idle state in which light is not emitted, and the controller to adjust the third light from the light guide based on a position of the touch input, and wherein the third color of the third light is a color corresponding to each of the input keys,
    wherein the controller increases an amount of the first light from the first LED when the detected touch input is closer to the second LED than the first LED,
    wherein the controller decreases an amount of the second light emitted from the second LED when the detected touch input is closer to the second LED than the first LED,
    wherein the controller controls an intensity of the third light from the light guide based on a number of touches of the touch input, wherein the light guide is between the substrate and the touch sensor, and wherein the input device is provided in a bezel area of the apparatus adjacent to the display.

5. An input device comprising:

a touch sensor to detect a touch input;

a first light emitting device (LED) to provide a first light having a first color and arranged at a first end of the touch sensor;

a second light emitting device (LED) to provide a second light having a second color and arranged at a second end of the touch sensor;

a substrate formed of a transparent material, and a plurality of input keys to be displayed on the transparent substrate;

a light guide to receive the first light from the first LED at a first end of the light guide and to receive a second light from the second LED at a second end of the light guide, and the light guide to output a third light having a third color based on a combination of the first light and the second light, and the light guide disposed below the substrate;

a proximity sensor to detect a user's finger that approaches the input device within the predetermined range;

a reflection layer disposed between the light guide and the touch sensor; and a controller to control an emission of light from at least one of the first light emitting device or the second light emitting device in an active state, when the proximity sensor detects that the user approaches the input device within the predetermined range in an idle state in which light is not emitted, and the controller controls an intensity of the third light from the light guide based on the determined touch input, wherein the third color of the third light is a color corresponding to each of the input keys, wherein the controller increases an amount of the first light from the first LED when the determined touch input is closer to the second LED than the first LED, and wherein the controller decreases an amount of the second light from the second LED when the determined touch input is closer to the second LED than the first LED, wherein the controller controls the intensity of the third light from the light guide based on a number of touches of the touch input, and wherein the light guide is between the substrate and the touch sensor.

* * * * *